(12) United States Patent
Dettmann et al.

(10) Patent No.: US 6,455,983 B2
(45) Date of Patent: *Sep. 24, 2002

(54) PIEZOELECTRIC MOTOR

(75) Inventors: Norbert Dettmann, Herzogenrath; Gerhard Diefenbach, Aachen; Franz-Josef Küppers, Würselen; Christian Reichinger, Alsdorf, all of (DE)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/291,555

(22) Filed: Apr. 14, 1999

(30) Foreign Application Priority Data

Apr. 17, 1998 (DE) .......................... 198 17 038

(51) Int. Cl.[7] ................................................ H02N 2/00
(52) U.S. Cl. ..................................................... 310/328
(58) Field of Search ......................................... 310/328

(56) References Cited

U.S. PATENT DOCUMENTS 3,285,074 A * 11/1966 Elazar ........................ 310/328
5,252,884 A * 10/1993 Dona .......................... 310/328
5,714,833 A * 2/1998 Zumeris ...................... 310/328

FOREIGN PATENT DOCUMENTS

EP          755054         7/1996  .......... G11B/19/20

* cited by examiner

*Primary Examiner*—Thomas M. Dougherty
(74) *Attorney, Agent, or Firm*—Ernestine C. Bartlett

(57) ABSTRACT

The invention relates to a motor having a cuboid piezoelectric element (1) which carries an actuating member (2) for transmitting a force in an actuating direction (x). In known motors the piezoelectric element (1) is restrained by four restraining elements which are disposed in the plane of vibration (x/y plane) and which exert a preloading force on the piezoelectric element (1) in a direction perpendicular to the actuating direction (x). However, this gives rise to a frictional force between the restraining elements and the piezoelectric element, which reduces the vibration quality and, as a consequence, the motor power. This is avoided by means of the invention, where the piezoelectric element (1) is restrained by means of restraining elements (20, 21, 22, 23) without preloading, i.e. with maximal slidability in the directions (y, z) perpendicular to the actuating direction (x). Preferably, such a motor is used in drive apparatuses, particularly for driving the read/write unit on a pivotable arm or on a translatable slide.

19 Claims, 4 Drawing Sheets

PIEZOELECTRIC MOTOR

BACKGROUND OF THE INVENTION

The invention relates to a motor including a cuboid piezoelectric element with a plane of vibration (xy), abounding surface extending perpendicularly to an actuating direction (x) and carrying an actuating member (2) for transmitting a force in the actuating direction (x), and an opposed bounding surface carrying a preloading element.

Such a motor is known from, for example, EP-A 755, to which U.S. Pat. No. 5,714,833 corresponds. Such a motor is used in, for example, CD drives for driving a shaft on which an arm carrying a read/write head is mounted, which arm should be moved over the CD in a radial direction. The piezoelectric element, which takes the form of a rectangular plate, has an actuating member by means of which a force can be transmitted to the shaft in an actuating direction, as a result of which the shaft is driven. The piezoelectric element is constructed in such a manner and is energized in such a way that it vibrates in a plane of vibration in which also the actuating direction lies and that the actuating member moves in accordance with an elliptical curve.

In the known motor the piezoelectric element is mounted by means of four restraining elements, two rigid restraining elements acting upon a first bounding surface of the piezoelectric element, which surface extends perpendicularly to the plane of vibration and parallel to the actuating direction, and two resilient restraining elements acting on the opposite bounding surface. The resilient restraining elements provide a preload between the piezoelectric element and a motor housing in order to ensure that the piezoelectric element, which is comparatively thin in a direction perpendicular to the plane of vibration, cannot perform a rotation about an axis perpendicular or parallel to the actuating direction and thereby change its position. However, the resilient restraining elements also give rise to a frictional force between all the restraining elements and the piezoelectric element, which force reduces the quality factor and hence the power of the motor.

SUMMARY OF THE INVENTION

It is an object of the present invention to improve the known motor with respect to the afore-mentioned drawbacks and, particularly, to increase the efficiency.

This object is achieved by restraining the piezoelectric element in directions (y,x) perpendicular to the actuating direction (x) by means of restraining elements, without preloading. It was recognized that the vibration quality of the piezoelectric element and, consequently, the power of such a motor can be increased in that, although the piezoelectric element is restrained, this restraint can be achieved with maximal slidability and without a preloading force being applied to the piezoelectric element in the directions perpendicular to the actuating direction. In the case of restraining with maximal slidability no frictional forces that could affect the vibration quality can occur between the piezoelectric element and the restraining elements. Thus, in accordance with the invention, restraining elements can be disposed in the plane of vibration, also outside the plane of vibration (for example in a plane perpendicular to the plane of vibration or in a plane which is inclined with respect to the plane of vibration), or also in a plurality of such planes. Essential is the property of the restraining elements that restraining is effected with a maximal slidability and without a preloading force being applied in a direction perpendicular to the actuating direction.

According to a preferred embodiment, the restraining elements used in the known motor have been dispensed with completely. Instead, restraining elements are arranged on the bounding surfaces of the piezoelectric element which extend parallel to the plane of vibration, which restraining elements specifically prevent the piezoelectric element from being rotated about an axis which extends perpendicularly or parallel to the actuating direction in the plane of vibration.

Further variants of the motor enable the motor to be manufactured in a simpler and cheaper manner by the use of fewer and simpler-to-manufacture parts. Mounting the electrical connections on the control electrodes of the piezoelectric element can then also be simplified.

Such a motor can be used for the purpose of moving a movable element in a direction perpendicular to the actuating direction or to drive an element which is rotatable about an axis of rotation which is oriented perpendicularly to the plane of vibration. Possible uses are for example in drive mechanisms for the read and/or write unit, particularly in optical drives such as CD or DVD drives, in which the optical unit should be moved over the optical data carrier in a radial direction with a maximal speed and with a minimal amount of space and power being required for this. Other possible uses are all situations where magnetic fields produced by conventional electric motors may affect the correct operation of an apparatus, as for example in medical uses (for example in nuclear spin tomography), or where such magnetic fields are undesirable for other reasons, as for example in shavers.

DETAILED DESCRIPTION OF THE PREFERRED EMBODIMENTS

Figure 1A:
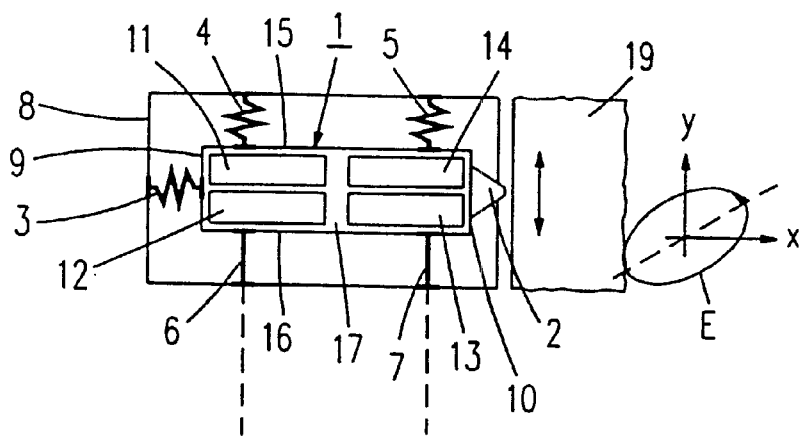
FIG. 1A shows a known motor.

FIG. 1A shows a known motor having a piezoelectric element 1 which on a first bounding surface 10 carries an actuating member 2 and on a second bounding surface 9, opposite the first bounding surface 10, carries a preloading element 3, for example a spring, which urges the piezoelectric element 1 against the motor housing 8 in the actuating direction (=x direction). Two resilient restraining elements 4, 5 are interposed between the housing 8 and the bounding surface 15 of the piezoelectric element 1 and produce a preloading force in the y direction. Two rigid restraining elements 6, 7 are interposed between the housing 8 and the opposite bounding surface 16. The upper surface 17 of the piezoelectric element 1 carries four planar control electrodes 11, 12, 13, 14 and the opposite lower surface of the piezoelectric element 1 carries a common reference electrode (not shown). The direction of polarization of the piezoelectric element 1 underneath the control electrodes 11, 12, 13, 14 is the same all over. With the aid of control means (not shown) the piezo electric element 1 is driven via the control electrodes 11, 12, 13, 14 in such a manner that the piezoelectric element 1 vibrates in the plane of vibration (x/y plane), the vibration being a superposition of two orthogonal waves (in the x and the y direction, respectively). By an appropriate control and by an appropriate choice of the geometry of the piezo electric element 1 the resonant frequencies of the two orthogonal waves can be adjusted in such a manner that both waves are excited with adequate amplitudes and with the desired phase relationship and that the actuating member 2 moves for example in accordance with a curve in the x/y plane, particularly in accordance with an elliptical curve E whose major axis forms an angle of, for example, 30° relative to the x axis, and thus moves the element 19 in the y direction by abutment against the element 19.

Figure 1B:
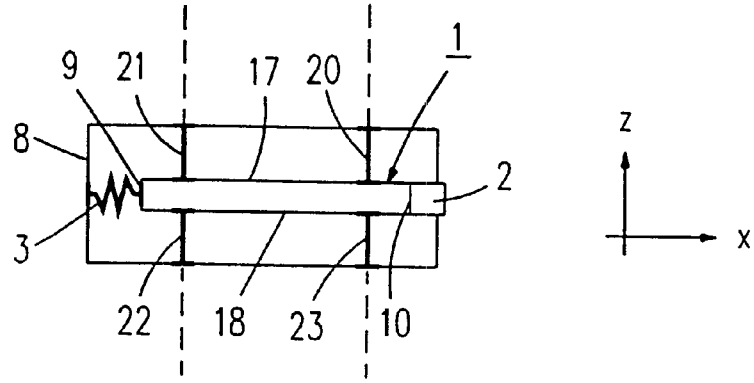
FIG. 1B shows a motor in accordance with the invention.

FIG. 1B shows a motor in accordance with the invention which, instead of the restraining elements 4, 5, 6, 7, comprises rigid restraining elements 20, 21, 22, 23 which extend in a z direction. These elements merely restrain the piezoelectric element 1 in the z direction but without preloading forces being applied to this piezoelectric element. However, a rotation of the piezoelectric element 1 about an axis oriented in the y direction and about an axis oriented in the x direction is inhibited, which in the known arrangement shown in FIG. 1a was solved by preloading with the aid of the restraining elements 4, 5. Even when the restraining elements 20, 21, 22, 23 extend substantially over the whole width of the piezoelectric element 1 (in the y direction), hardly any frictional forces occur at the locations of contact between the restraining elements 20, 21, 22, 23 and the respective bounding surfaces 17 and 18 of the piezoelectric element 1, because restraining is effected in a slidable fashion. As a result of this, a higher resonance quality can be achieved, so that the efficiency of the motor in accordance with the invention is distinctly higher and, if desired, the voltage required for the operation of the motor can be reduced.

Figure 1C:
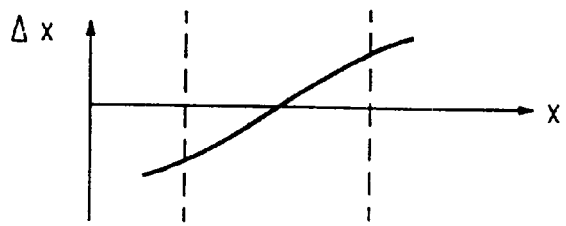
FIGS. 1C, 1D show the waveforms of the waves occurring in a motor in accordance with the invention.
Figure 1D:
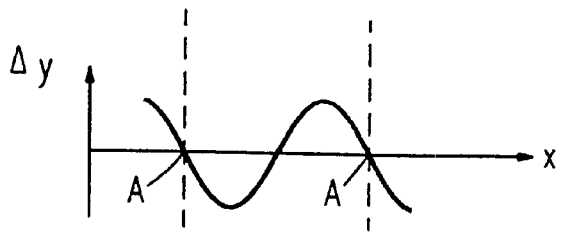

FIGS. 1C and 1D represent the amplitude waveforms of the two orthogonal waves in the x and the y direction, respectively, in the case that the motor operates in the longitudinal direction x of the piezoelectric element 1. FIG. 1C shows the waveform of the transverse wave and FIG. 1D shows the waveform of the longitudinal wave. Superposition of the two waves yields the elliptical curve along which the actuating member 2 moves, as described above. Both in the known motor and in the motor in accordance with the invention the restraining elements are arranged in the vibration nodes A, i.e. at locations in the x direction where the wave has a zero point in the y direction. However, during operation of the motor the position of the node in the x direction varies. In the known arrangement this movement is impeded as a result of the resilient restraint by means of the restraining elements 4, 5, which leads to efficiency losses, whereas in the arrangement in accordance with the invention this movement is not impeded owing to the sliding configuration of the restraining elements 20, 21, 22, 23 and thus enables a higher efficiency of the motor to be obtained.

In the embodiment shown in FIG. 1B, having restraining elements 20, 21, 22, 23 in the z direction, one or more additional stop elements may be provided, which limit the excursion of the piezoelectric element 1 in the y direction. As an alternative for the embodiment shown in FIG. 1B, an embodiment of the invention is possible having four restraining elements which are rigid in the y direction instead of the four restraining elements 20, 21, 22, 23 which are rigid in the z direction, in which case preferably one or more stop elements are provided which limit the excursion of the piezoelectric element in the y direction.

Figure 2:
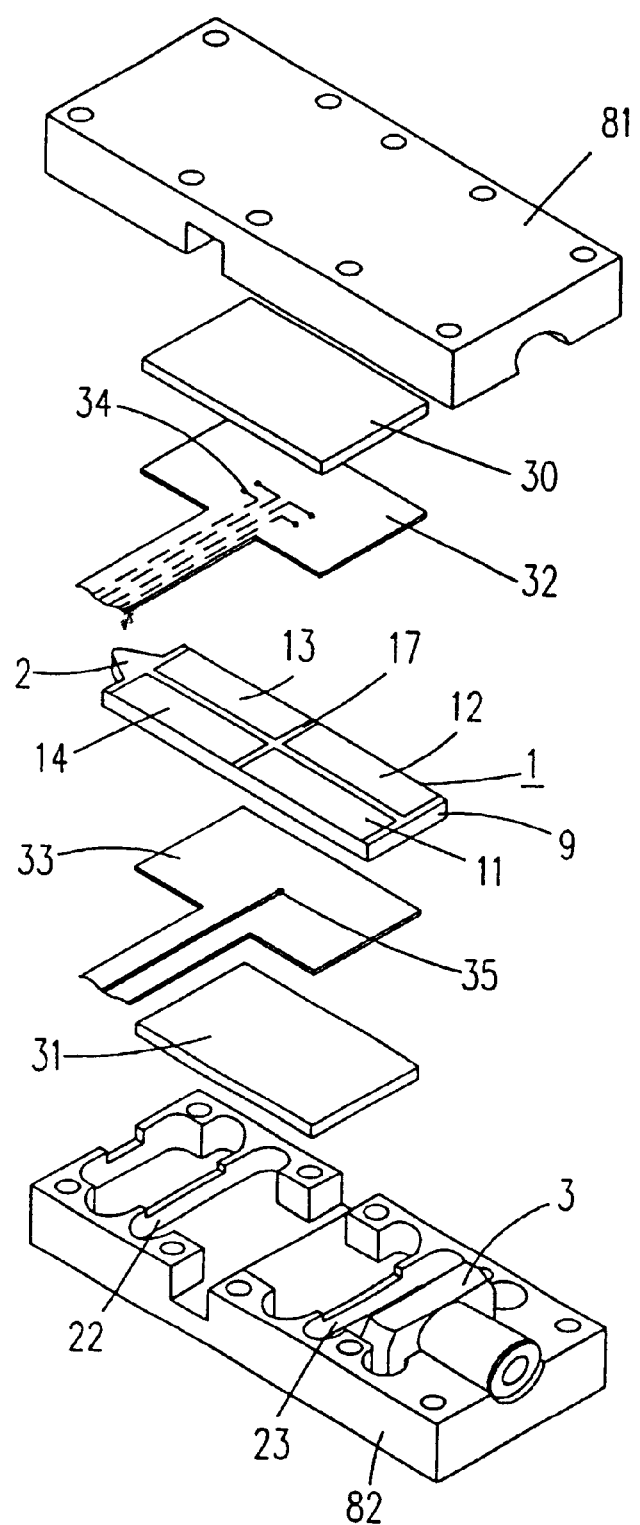
FIG. 2 shows an embodiment of the motor in accordance with the invention.

FIG. 2 shows a possible embodiment of the motor in accordance with the invention. The restraining elements 20 to 23 (of which only the elements 22, 23 are shown) have been integrated in the housing, which comprises two housing sections 81, 82. The preloading element 3 takes the form of a rubber part inserted in the housing section 82. The bounding surfaces 17 and 18 of the piezoelectric element 1 are each covered with a conductor track foil, 32 and 33 respectively, which carries the contact means 34, 35 for establishing electrical contact with the control electrodes 11 to 14 and the reference electrode (not shown), and corresponding leads to the contact means 34, 35. Preferably, the contacts 34 are also arranged in the proximity of the vibration nodes, which enables the highest values for the resonant quality to be attained. However, as is shown, the contact points 34 may also be arranged substantially in the center of the piezoelectric element 1, where the contact point 35 is also situated. The use of such conductor track foils 32, 33 is simpler and cheaper than the use of wires bonded or soldered to the electrodes, which is basically also possible. In addition, further pressure elements 30, 31 may be provided, which apply an adequate pressure to press the conductor track foils 32, 33 against the piezoelectric element 1, in order to establish stable contact.

Figure 3:
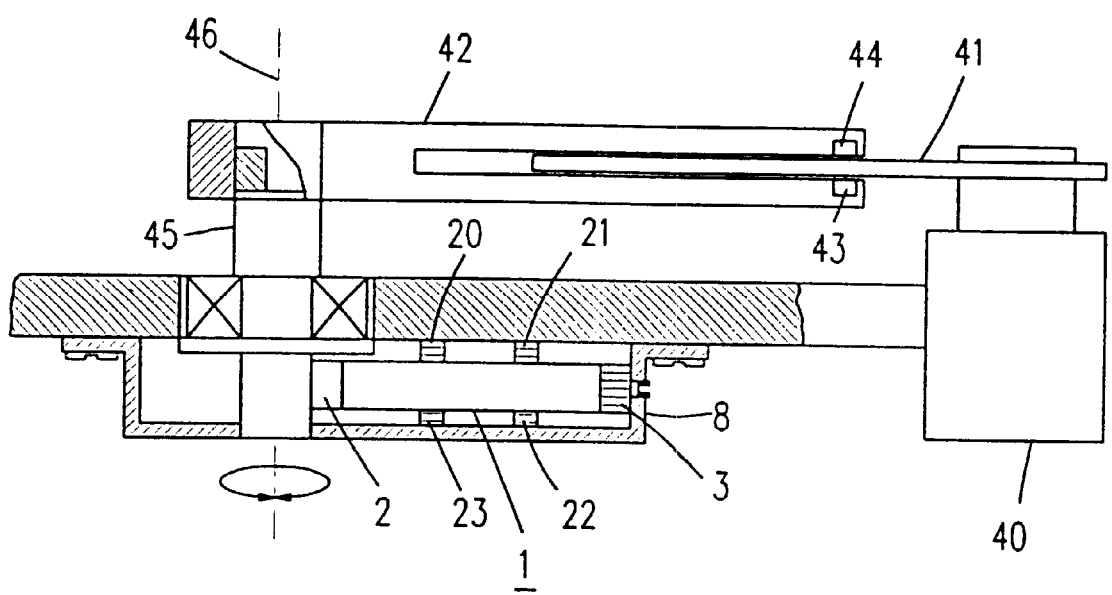
FIG. 3 shows a CD drive including a motor in accordance with the invention.

FIG. 3 shows the use of a motor in accordance with the invention in a CD drive. In such drives an arm 42 carrying a read/write head 43, 44 should be moved over a CD 41 in a radial direction, which CD is driven by a motor 40. The arm 42 is mounted on a shaft 45 which is rotatable about an axis of rotation 46 and which can be driven by a motor in accordance with the invention. For this purpose, a piezoelectric element 1 is arranged in a housing section 8 and is restrained by rigid restraining elements 20, 21, 22, 23 and urged against the shaft 45 by a preloading element 3. The actuating member 2 transmits a force to the shaft 45, which is rotatable in both directions of rotation in dependence on the drive applied to the piezoelectric element 1, as a result of which the arm is moved over the CD 41 in the desired direction.

Figure 4:
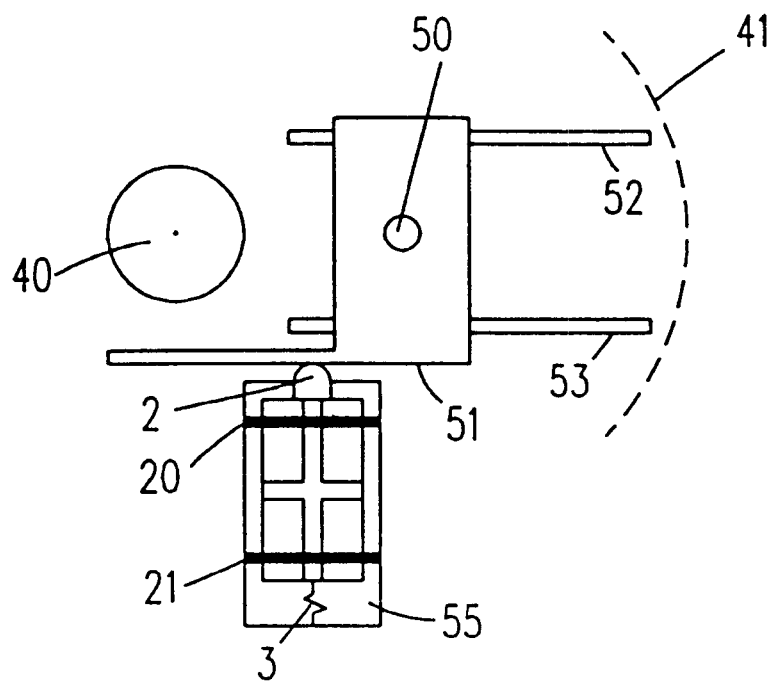
FIG. 4 shows another CD drive including a motor in accordance with the invention.

FIG. 4 shows a further embodiment of a CD drive including a motor 55 in accordance with the invention. The read/write head is situated behind a lens 50. The entire read/write unit is accommodated on a slide 51 and by means of the motor 55 in accordance with the invention it is linearly moved in the radial direction of the CD 41 along two guides 52, 53. The motor 55 can be fixedly mounted in the housing of the CD drive and act on the slide 51 via the actuating member 2 and thereby move this slide.

Figure 5:
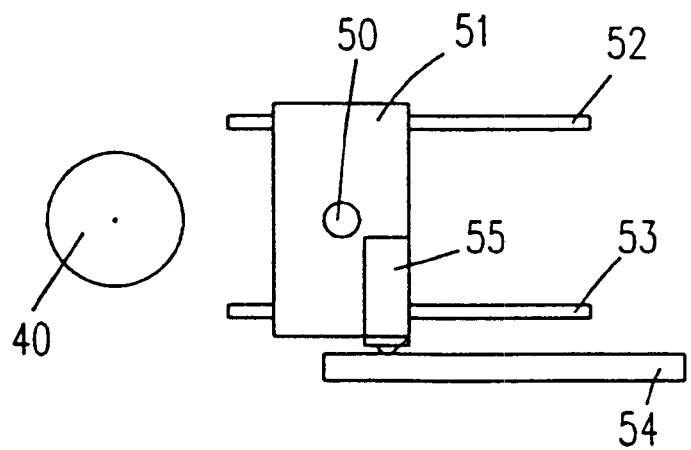
FIG. 5 shows a third CD drive including a motor in accordance with the invention.

FIG. 5 shows a further embodiment in which the motor 55 is arranged on the slide 51. The actuating member 2 acts upon a part of the housing 54 of the drive and the motor 55 and the slide 51 are moved jointly.

What is claimed is:

1. A motor comprising a piezoelectric element; means for exciting longitudinal and transverse vibration of said element in a plane of vibration, the longitudinal and transverse vibrations defining a plane of vibration; means for providing a preloading force in a direction of the longitudinal vibration; and means for restraining movement in a direction perpendicular to the longitudinal vibration, said element having a first bounding surface which extends perpendicularly to a direction of the longitudinal vibration of said element, said first bounding surface carrying an actuating member for transmitting a force in an actuating direction, and a second bounding surface opposite said first bounding surface engaged by said means for providing a preloading force, and said element having a first pair of bounding faces extending parallel to the plane of vibration, characterized in that said means for restraining comprises restraining elements respectively arranged for slidable engagement, without preloading, with each of the bounding faces of said first pair.

2. A motor as claimed in claim 1, characterized in that the restraining elements are rigid elements.

3. A motor as claimed in claim 1, characterized in that the restraining elements extend substantially across a width of said first pair of bounding faces.

4. A motor as claimed in claim 1, characterized in that the rigid restraining elements are disposed in vibration nodes of a transverse wave of the piezoelectric element, said transverse wave traveling in the actuating direction.

5. A motor as claimed in claim 1, characterized in that one of the bounding faces of said first pair carries four contact elements for control electrodes, disposed substantially in the vibration nodes of a transverse wave of the piezoelectric element, said transverse wave traveling in the actuating direction.

6. A motor as claimed in claim 1, characterized in that said element has a second pair of bounding faces extending parallel to the plane of vibration and parallel to the direction of the longitudinal vibration, and the bounding faces of said second pair are free from engagement with restraining elements.

7. A motor as claimed in claim 1, characterized in that said element has a second pair of bounding faces extending parallel to the plane of vibration and parallel to the direction of the longitudinal vibration, and motor further comprises at least two rigid restraining elements engaging said second pair of bounding faces.

8. A motor as claimed in claim 1, characterized in that said element has a second pair of bounding faces extending parallel to the plane of vibration and parallel to the direction of the longitudinal vibration, and motor further comprises stop elements for limiting excursion of the piezoelectric element in a direction parallel to the plane of vibration and perpendicular to the direction of the longitudinal vibration.

9. A motor as claimed in claim 1, characterized in that said element has a second pair of bounding faces extending parallel to the plane of vibration and parallel to the direction of the longitudinal vibration, and one of the bounding faces of said first pair carries four contact elements for control electrodes, disposed substantially halfway between the second pair of bounding faces.

10. A motor as claimed in claim 1, characterized in that said restraining elements are integrated in a housing which accomodates the piezoelectric element.

11. A motor as claimed in claim 10, characterized in that a support for said means for providing a preloading force is integrated in said housing.

12. A use of the motor as claimed in claim 1 for driving a driving element in a direction perpendicular to the direction of longitudinal vibration.

13. A use of the motor as claimed in claim 1 for driving an arm which is rotatable about an axis of rotation which extends perpendicularly to the plane of vibration.

14. A motor comprising a piezoelectric element; means for exciting longitudinal and transverse vibration of said element in a plane of vibration, the longitudinal and transverse vibrations defining a plane of vibration; means for providing a preloading force in a direction of the longitudinal vibration; and means for restraining movement in a direction perpendicular to the longitudinal vibration, said element having a first bounding surface which extends perpendicularly to a direction of the longitudinal vibration of said element, said first bounding surface carrying an actuating member for transmitting a force in an actuating direction, and a second bounding surface opposite said first bounding surface engaged by said means for providing a preloading force, and said element having a first pair of bounding faces parallel to said plane of vibration, and a second pair of bounding faces perpendicular to the plane of vibration, characterized in that said means for restraining comprises rigid restraining elements respectively arranged for slidable engagement, without preloading, with each of the bounding faces of one of said pairs.

15. A drive apparatus for reading/writing information from/on a data carrier, including a read/write unit, wherein for driving and read/write unit the drive apparatus includes a motor comprising a piezoelectric element; means for exciting longitudinal and transverse vibration of said element in a plane of vibration, the longitudinal and transverse vibrations defining a plane of vibration; means for providing a preloading force in a direction of the longitudinal vibration; and means for restraining movement in a direction perpendicular to the longitudinal vibration, said element having a first bounding surface which extends perpendicularly to a direction of the longitudinal vibration of said element, said first bounding surface carrying an actuating member for transmitting a force in an actuating direction, and a second bounding surface opposite said first bounding surface engaged by said means for providing a preloading force, and said element having a first pair of bounding faces extending parallel to the plane of vibration, characterized in that said means for restraining comprises restraining elements respectively arranged for slidable engagement, without preloading, with each of the bounding faces of said first pair.

16. A motor as claimed in claim 15, characterized in that the restraining elements are rigid elements.

17. A motor as claimed in claim 15, characterized in that the restraining elements extend substantially across a width of said first pair of bounding faces.

18. A drive apparatus as claimed in claim 15, characterized in that each of the bounding faces of the piezoelectric element which extend parallel to the plane of vibration is engaged by at least two of said rigid restraining elements, and the bounding faces of the second of said pairs are free from engagement with restraining elements.

19. A drive apparatus as claimed in claim 15, characterized in that the rigid restraining elements extend substantially across a width of the piezoelectric element.

* * * * *